(12) United States Patent
Yudasaka et al.

(10) Patent No.: US 7,405,134 B2
(45) Date of Patent: Jul. 29, 2008

(54) METHOD OF MANUFACTURING A SEMICONDUCTOR DEVICE AND ELECTRONIC EQUIPMENT

(75) Inventors: Ichio Yudasaka, Chino (JP); Hideki Tanaka, Chino (JP)

(73) Assignee: Seiko Epson Corporation, Tokyo (JP)

( * ) Notice: Subject to any disclaimer, the term of this patent is extended or adjusted under 35 U.S.C. 154(b) by 345 days.

(21) Appl. No.: 11/065,126

(22) Filed: Feb. 24, 2005

(65) Prior Publication Data

US 2005/0196910 A1 Sep. 8, 2005

(30) Foreign Application Priority Data

Mar. 4, 2004 (JP) ............... 2004-060519

(51) Int. Cl.
*H01L 21/00* (2006.01)
(52) U.S. Cl. ...................... 438/401; 438/149
(58) Field of Classification Search .......... 438/401, 438/149
See application file for complete search history.

(56) References Cited

U.S. PATENT DOCUMENTS

| | | | | |
|---|---|---|---|---|
| 5,514,466 | A * | 5/1996 | Yamada et al. | 428/328 |
| 5,969,428 | A * | 10/1999 | Nomura et al. | 257/797 |
| 5,989,945 | A * | 11/1999 | Yudasaka et al. | 438/149 |
| 6,100,954 | A * | 8/2000 | Kim et al. | 349/138 |
| 6,180,987 | B1 * | 1/2001 | Gardner et al. | 257/401 |
| 6,359,606 | B1 * | 3/2002 | Yudasaka | 345/87 |
| 6,376,924 | B1 * | 4/2002 | Tomita et al. | 257/797 |
| 6,377,685 | B1 * | 4/2002 | Krishnan | 379/433.07 |
| 6,503,831 | B2 * | 1/2003 | Speakman | 438/674 |
| 6,514,801 | B1 * | 2/2003 | Yudasaka et al. | 438/151 |
| 6,624,018 | B1 * | 9/2003 | Yu et al. | 438/239 |
| 6,624,071 | B2 * | 9/2003 | Seki | 438/681 |
| 7,265,021 | B2 * | 9/2007 | Yudasaka et al. | 438/401 |
| 7,288,792 | B2 * | 10/2007 | Yudasaka | 257/72 |
| 7,294,900 | B2 * | 11/2007 | Asano | 257/472 |
| 2001/0001050 | A1 * | 5/2001 | Miyashita et al. | 428/690 |
| 2001/0043046 | A1 * | 11/2001 | Fukunaga | 315/160 |
| 2002/0054197 | A1 * | 5/2002 | Okada et al. | 347/101 |
| 2002/0160103 | A1 * | 10/2002 | Fukunaga et al. | 427/125 |
| 2005/0161836 | A1 * | 7/2005 | Yudasaka et al. | 257/797 |
| 2005/0184293 | A1 * | 8/2005 | Yudasaka | 257/72 |
| 2005/0196910 | A1 * | 9/2005 | Yudasaka et al. | 438/149 |
| 2005/0212447 | A1 * | 9/2005 | Oh et al. | 315/169.3 |
| 2005/0274979 | A1 * | 12/2005 | Asano | 257/192 |
| 2006/0290874 | A1 * | 12/2006 | Yoon et al. | 349/158 |

FOREIGN PATENT DOCUMENTS

| | | |
|---|---|---|
| JP | A 6-216258 | 8/1994 |
| JP | A 7-45706 | 2/1995 |
| JP | A 2001-267320 | 9/2001 |
| JP | A 2003-309369 | 10/2003 |

\* cited by examiner

*Primary Examiner*—Laura M Schillinger
(74) *Attorney, Agent, or Firm*—Oliff & Berridge, PLC

(57) ABSTRACT

Exemplary embodiments of the present invention provide a method of manufacturing a semiconductor device that can take a connection between layers without giving damage to a layer, which is underlying. The semiconductor device includes forming conductive members Ms and Md at a predetermined position of a semiconductor film, forming an insulating film on a whole surface of a substrate excluding the conductive members Ms and Md, and forming a conductive film that is connected to the semiconductor film with the conductive member Ms and Md.

16 Claims, 6 Drawing Sheets

METHOD OF MANUFACTURING A SEMICONDUCTOR DEVICE AND ELECTRONIC EQUIPMENT

BACKGROUND

Exemplary embodiments of the present invention relate to a method of manufacturing a semiconductor device and electronic equipment.

In electronic devices, such as semiconductor devices, multilayer wiring structure may be adopted for the purpose of high integration. With such a structure, in order to have connection between layers, contact holes are needed. The contact holes are formed by dry etching as disclosed in Japanese Unexamined Patent Publication No. 2001-267320.

SUMMARY

As mentioned above, by the related art method, since dry etching is used, expensive vacuum equipment is needed. By processing using vacuum equipment, much time, effort, and energy are needed to form the contact holes, and maintain the vacuum equipment. In addition, by dry etching, a problem arises in which punch-through occurs in semiconductor film, which is underlying, by excess etching due to an insufficient selective ratio between insulating film and semiconductor film.

In view of such a situation, exemplary embodiments of the present invention aims to provide a method of manufacturing a semiconductor device in which connections between layers can be taken without giving damage to the layers that are underlying.

In order to address or solve the above-mentioned and/or other problems, a method of manufacturing a semiconductor device in which a semiconductor film, an insulating film, and a conductive film are deposited on a substrate according to one exemplary aspect of the present invention includes the following: forming the conductive member to a predetermined position of the semiconductor film; forming the insulating film on a whole surface of the substrate excluding the conductive member; and forming the conductive film on the insulating film, the conductive film being electrically connected to the semiconductor film with the conductive member.

In this method, the conductive member to connect among layers is formed before forming the insulating film. Then, the insulating film is formed so as to fill the surrounding of the conductive member with it. Thus, it is not necessary to open contact holes after forming an insulating layer as in the related art way, resulting in little or no etching damage to the semiconductor layer, which is underlying.

In the method of manufacturing a semiconductor device, forming the conductive member can include selectively discharging a liquid material containing a conductive material to the predetermined position of the semiconductor film by a droplet discharge method. Using a liquid-phase process, processes are simplified and manufacturing equipment can be downsized.

In the method, forming the conductive member can include forming a bank layer that includes an opening at a predetermined position of the semiconductor film on the substrate before discharging the liquid material and selectively discharging the liquid material into the opening of the bank layer. In the method, by adjusting the size of the opening of the bank layer, the liquid material can be reduced or prevented from wide spreading and fine conductive member can be fabricated.

Also in the method, the bank layer can be made of an organic material, for example, one made of a light-sensitive resist. In this case, forming the bank layer can include hardening the bank layer by irradiating an ultraviolet ray while heating the bank layer at a predetermined temperature, the bank layer is placed in an atmosphere in which oxygen and moisture are substantially absent (for example, in vacuum). This enhances heat resistance and solvent resistance of the bank layer and makes it possible to consistently conduct drying and annealing of the liquid material.

Also the method of manufacturing a semiconductor device, the insulating film can be formed by a liquid-phase processing. In this way, by employing a liquid-phase process into a part of manufacturing, manufacturing equipment can be downsized and throughput is increased. In addition, the surface of film is planarized, which reduces or prevents the breaking of wires and patterns provided on the surface. Also, using such flat film as the gate insulating film has advantages in which leakage current flowing through the gate insulating film is reduced and gate breakdown voltage is increased and so forth.

Also in the method of manufacturing a semiconductor device, the conductive member can be exposed on the surface of the insulating film. This makes it possible to use the conductive member as an alignment mark for patterning the conductive film. More specifically, here the conductive film may be formed by the following methods.

(1) Forming the conductive film may include depositing the conductive film on a whole surface of the substrate by a vacuum process and patterning the conductive film by using a concave-convex pattern as an alignment mark, the concave-convex pattern being caused by the conductive member protruded from a surface of the insulating film.

(2) Forming the conductive film may include depositing the conductive member on the whole surface of the substrate by a liquid-phase processing and patterning the conductive film by using the conductive member as an alignment mark, the conductive member being exposed on a surface of the conductive film.

In the method of (2), the conductive film and the conductive member can be formed such that both top surfaces are substantially on the same plane.

Also in the method of manufacturing a semiconductor device, the conductive film is the conductive film for a gate wiring and patterning the conductive film can be forming a first conductive pattern at a position facing the semiconductor film to serve as the gate wiring and a second pattern at a position of the insulating film including the conductive member to serve as a source wiring or a drain wiring. In the method, by patterning the conductive film, one or both of the source wiring or the drain wiring, or one or both of a part of the source wiring (intermediate electrode between the semiconductor film and the source wiring etc.) or a part of the drain wiring (intermediate electrode between the semiconductor film and the drain wiring etc.) is formed in the same layer in which the gate wiring is formed. By leaving the conductive film to the position of the source region or the drain region as described above, the height of the gate wiring part and the source wiring part and the drain wiring part can be substantially the same. Thus, for example, in the case where the interlayer insulating film is formed on the gate wiring and contact holes are formed to the position of the gate wiring and the intermediate electrode, these contact holes can be formed all together with the same conditions. Especially, if the conductive film is formed by a liquid-phase processing, top surfaces of the conductive film and the conductive member can form a substantially flat plane. Thus, the contact holes can be formed more easily.

Also in the method of manufacturing a semiconductor device, the conductive member can be extended to another semiconductor film forming region formed at a position different from a position at which the semiconductor film is formed and used as a part of wiring for another semiconductor device associated with the another semiconductor film. For example, an inverter circuit or the like can be easily fabricated by using the conductive member as the gate wiring of another semiconductor device.

Electronic equipment of a second exemplary aspect of the present invention includes a semiconductor device manufactured by the method described above. This method can provide high performance electronic equipment.

DETAILED DESCRIPTION OF EMBODIMENTS

Figure 1A:
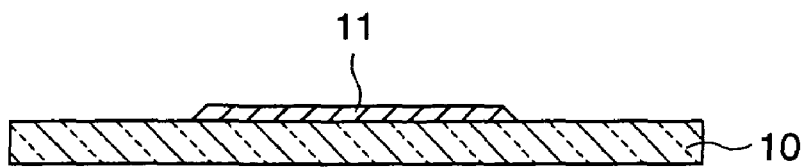
FIGS. 1A through 1E are schematics showing a method of manufacturing a thin-film transistor of a first exemplary embodiment of the present invention.

Exemplary embodiments of the present invention will now be described below with reference to the accompanying drawings. In the accompanying drawings, the film thickness and the scale of each element is adequately changed, so that they are visible.

First Exemplary Embodiment

Referring to FIGS. 1 and 2, a first exemplary embodiment of the present invention will now be described. FIGS. 1 and 2 are schematics showing a method for manufacturing a thin film transistor (TFT) which is an example of semiconductor devices according to exemplary embodiments of the present invention. The drawings schematically show only a TFT forming region (element area) in a magnified form. In the accompanying drawings, the film thickness and the scale of each element is adequately changed, so that they are visible.

Forming a Semiconductor Film

First, a substrate 10 for manufacturing a TFT is provided. Examples of the substrate 10 may include both insulating substrates made of quartz, glass, heat-resistant plastic, etc., and conductive substrates made of semiconductor materials including silicon wafers, stainless steel, etc. On the surface of the substrate 10, an underlying protective film made of an insulating material, such as a silicon oxide film, silicon nitride film, or silicon oxiynitride film, can be formed if necessary, so that sodium and other moving ions contained in the substrate do not get mixed in a semiconductor film that will be described later.

Next, a semiconductor film to form an active layer of a TFT is formed on the substrate 10. While the semiconductor film is an amorphous silicon film in this example, the semiconductor film may be made of other semiconductor materials such as germanium. Otherwise, semiconductor films of a complex of Group IV elements, e.g. silicon and germanium, silicon and carbon, germanium and carbon; semiconductor films of a complex compound of Group III and Group V elements, e.g. gallium and arsenic, indium and antimony; and semiconductor films of a complex compound of Group II and Group VI elements, e.g. cadmium and selenium can be used. In addition, N-type semiconductor films in which donor elements of, for example, phosphorous (P), arsenic (As), or antimony (Sb) are doped in the above-described semiconductor films; and P-type semiconductor films in which acceptor elements of, for example, boron, aluminum (Al), gallium (Ga), or indium (In), are doped in the above-described semiconductor films can also be used.

The semiconductor film is formed by CVD (chemical vapor deposition) such as APCVD, LPCVD, and PECVD, and PVD (physical vapor deposition) such as sputtering and evaporation.

Crystallizing the Semiconductor Film

The semiconductor film, which has been deposited, is then crystallized. Here, "crystallization" is defined as not only transforming an amorphous semiconductor film into a polycrystalline or single crystal silicon film by providing thermal energy, but also enhancing quality of the crystalline film or recrystallizing a microcrystalline or polycrystalline semiconductor film by providing thermal energy or by melting and solidifying. According to exemplary embodiments, crystallization refers not only to the crystallization of amorphous substances but also to the crystallization of polycrystalline and microcrystalline substances.

Examples of crystallization processing of the semiconductor film may include, but not be limited to, laser irradiation, rapid heating (e.g. lamp annealing, thermal annealing), and solid-phase growth. Laser annealing is employed in this example to crystallize the semiconductor film, which is amorphous, so as to transform it into a polycrystalline semiconductor film (e.g. polysilicon film). Here, an excimer laser, argon ion laser, the second and third harmonic of an yttrium-aluminum-garnet (YAG) laser, etc., with a wavelength within or around the range of ultraviolet rays, are preferably used as laser light. For example, a line beam of an excimer laser whose longer length is 400 mm with output strength of 400 mJ/cm$^2$ can be used. It is desirable to scan a line beam in its shorter length (the width of beam) direction such that 90% of the width is overlapped one by one.

Isolation

Then an isolation process is performed in order to define a TFT region. While etching is adopted for this isolation process in this example, local oxidation of silicon (LOCOS), field shield, shallow trench isolation, and other processes can be also used. This isolation process forms a polycrystalline semiconductor film 11 having a predetermined shape as shown in FIG. 1A on the substrate 10.

Forming Conductive Pillars

Figure 1B:
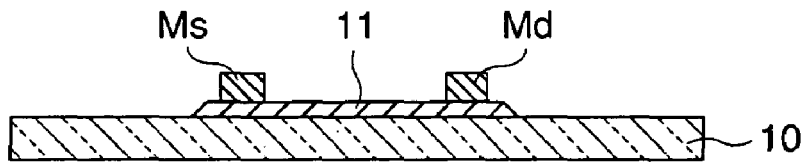

Next, as shown in FIG. 1B, conductive pillars (conductive members) Ms and Md having pillar shape are formed on the surface of the semiconductor film 11. These conductive pillars Ms and Md function as a contact plug to electrically connect a source region and a drain region of the semiconductor film 11 to intermediate electrodes for source 13$s$ and for drain 13$d$, both of which will be described later, respectively. In this example, the conductive pillars Ms and Md are formed thicker than a gate insulating film 12, which will be described later, so as to provide a concave-convex pattern on the surface of a gate wiring film 13 that is formed on the gate insulating film 12. The gate wiring film 13 is patterned by using the concave-convex pattern, and thereby the gate wiring 13g can be aligned with the semiconductor film 11, which is underlying, with high accuracy.

The conductive pillars Ms and Md can be formed by patterning and etching, for example, metal film such like aluminum deposited by sputtering. In this case, the thickness (height) of the conductive pillars Ms and Md is made thicker than that of the gate insulating film 12, which will be formed afterward. By this way, the conductive pillars Ms and Md remain above the gate insulating film 12. In other words, the upper end part of the conductive pillars is exposed from the surface of the gate insulating film 12.

Forming a Gate Insulating Film

Figure 1C:
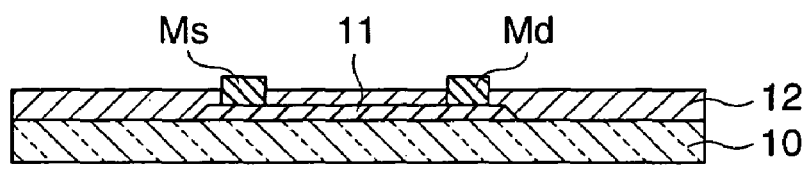

As shown in FIG. 1C, the gate insulating film 12 composed of silicon oxide etc., is deposited around the conductive pillars Ms and Md, that is, on the whole surface of the substrate excluding the conductive pillars Ms and Md, by liquid-phase processing. First, an embrocation containing xylene mixed with polysilazane (a liquid material containing polysilazane) is spin-coated on the substrate. Then, prebaking is performed at 100 to 150 degrees centigrade for five minutes. Subsequently, heat treatment is performed at 300 to 400 degrees centigrade in a wet $O_2$ atmosphere for 60 minutes. Performing the heat treatment in a wet $O_2$ atmosphere can reduce nitrogen components in the insulating film that cause polarization.

Thus, the gate insulating film 12 is provided.

While spin coating is used to apply the liquid material in this example, other known application methods, such as dip coating, roll coating, curtain coating, spraying, and droplet discharge method (e.g. ink jetting) can also be used. As the liquid material, other materials than polysilazane, such as polyimide and high-K materials dispersed and dissolved in a certain solvent such as xylene, can also be used.

Here, a cleaning step can be added if necessary between forming a semiconductor film and forming a gate insulating film. More specifically, after finishing patterning the semiconductor film 11, the substrate is irradiated with an ultraviolet ray in an oxygen-containing atmosphere so as to resolve and remove contaminants (organic matters etc.) remaining on the surface of the substrate. The ultraviolet rays used here are provided by a low-pressure mercury lamp with its peak strength at a wavelength of 254 nm, or an excimer lamp with its peak strength at a wavelength of 172 nm. The light of a wavelength within this range converts oxygen molecules ($O_2$) into ozone ($O_3$), and further into oxygen radicals (O*). Therefore, by using ozone or oxygen radicals produced here and having high degrees of activity, it is possible to efficiently remove organic matters attached to the surface of the substrate. Here, implanting impurities into a semiconductor film 11 (impurities implantation step) can be added if necessary between forming a semiconductor film and forming conductive pillars.

Forming a Gate Wiring and Intermediate Electrode

Figure 1D:
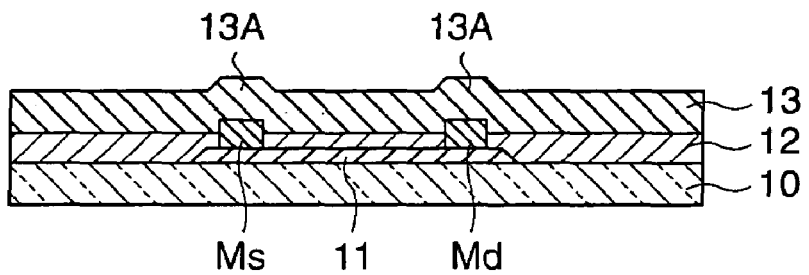

As shown in FIG. 1D, the gate wiring film 13 is deposited on the gate insulating film 12 so as to cover the surface of the gate insulating film 12 and the surface of the conductive pillars Ms and Md. The gate wiring film 13 is formed by depositing multi-layers of adequate metal (e.g. tantalum, aluminum, titanium), metal nitride, polysilicon, or other materials to a thickness of, for example, about 300 to 500 nm by an adequate method, such as sputtering, CVD, and vapor-deposition. In this step, the opaque gate wiring film 13 is provided on the whole surface of the substrate. Since the above-described conductive pillars Ms and Md are protruded from the surface of the gate insulating film 12, the concave-convex part 13A caused between the gate insulating film 12 and the conductive pillars Ms and Md is formed on the surface of the gate wiring film 13.

Figure 1E:
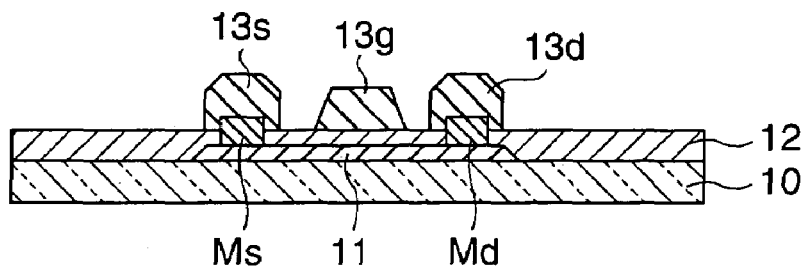

Next, as shown in FIG. 1E, the gate wiring film 13 is patterned so as to form a gate wiring 13g including a gate electrode, the intermediate electrode for source 13s and the intermediate electrode for drain 13d. Since the surface of the gate wiring film 13 has a concave-convex pattern reflecting the concave-convex pattern on the surface of the gate insulating film caused by the conductive pillars Ms and Md (i.e. the concave-convex part 13A), in this example as mentioned above, it is possible to pattern the gate wiring film 13 and intermediate electrodes 13s and 13d with high accuracy of alignment with the semiconductor film 11, which is underlying, by using the concave-convex part 13A as an alignment mark.

Here, the intermediate electrode for source 13s connects the source region of the semiconductor film 11 to the source wiring 15s, which will be described later. The intermediate electrode for drain 13d connects the drain region of the semiconductor film 11 to the drain wiring 15d, which will be described later. The intermediate electrodes function as a part of the source wiring and drain wiring, which will be described later, together with the conductive pillars. In this example, the intermediate electrode for source 13s is provided at the position including the conductive pillar Ms for source. The intermediate electrode for drain 13d is provided at the position including the conductive pillar Md for drain.

Forming an Interlayer Insulating Film

Figure 2A:
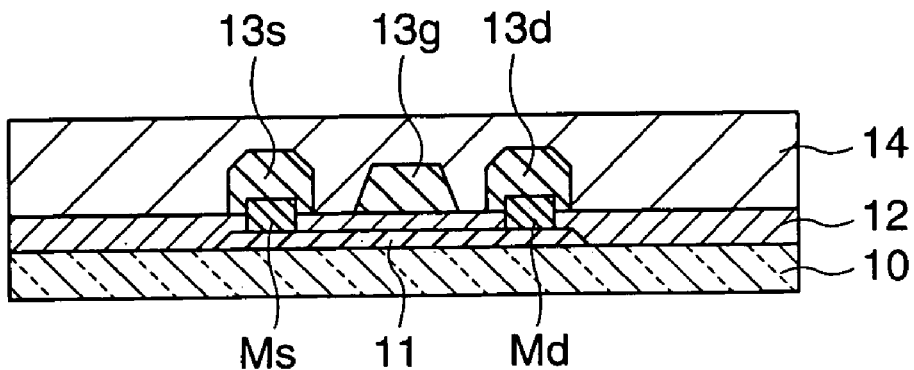
FIGS. 2A through 2C are schematics showing steps following the steps shown in FIGS. 1A through 1E.

As shown in FIG. 2A, an interlayer insulating film 14 is deposited on the whole surface of the substrate so as to cover the gate insulating film 12, the gate wiring 13g, and the intermediate electrodes 13s and 13d. The forming method of the interlayer insulating film 14 is the same as that of the gate insulating film 12. That is, an embrocation containing xylene mixed with polysilazane (a liquid material containing polysilazane) is spin-coated on the substrate. Then, prebaking is performed at 100 to 150 degrees centigrade for five minutes. Subsequently, heat treatment is performed at 300 to 400 degrees centigrade in a wet $O_2$ atmosphere for 60 minutes.

Forming Contact Holes

Figure 2B:
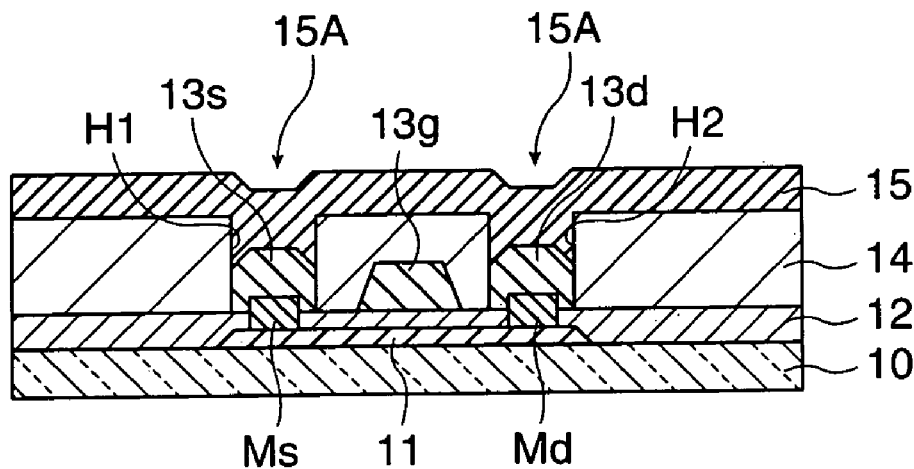

As shown in FIG. 2B, an opening (contact hole) H1 is formed by dry etching in a position corresponding to a source region of the interlayer insulating film 14. An opening (contact hole) H2 is formed in a position corresponding to a drain region of the interlayer insulating film 14. In addition, an opening that leads to the gate wiring 13g is opened simultaneously with the openings H1 and H2. In this example, the intermediate electrodes 13s and 13d are provided in the same insulating layer in which an opening for the gate wiring 13g is to be provided, the opening that leads to the gate wiring 13g can be collectively formed with the same conditions as the above-mentioned openings H1 and H2.

Forming a Source Wiring Layer and a Drain Wiring Layer

Next, a metal film 15 of aluminum, chromium, tantalum, or the like is deposited by sputtering, PVD, or other methods so as to cover the surface of the interlayer insulating film 14, and the inside of the openings H1 and H2. In this step, the metal film that is opaque is provided on the whole surface of the substrate. Since the interlayer insulating film 14 has the openings H1 and H2, the concave-convex part 15A reflecting the concave-convex patterns of the openings H1 and H2 are formed on the surface of the metal film 15.

Figure 2C:
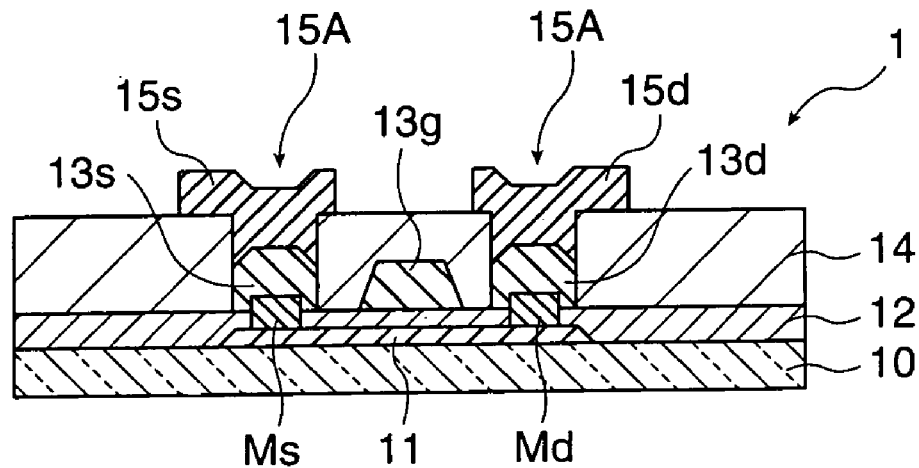

Next, as shown in FIG. 2C, the metal film 15 is patterned so as to form a source wiring 15s including a source electrode and a drain wiring 15d including a drain electrode. Since the surface of the metal film 15 has a concave-convex pattern (i.e. the concave-convex part 15A) reflecting the pattern of the openings H1 and H2, which are underlying, in this example as mentioned above, it is possible to pattern the metal film 15 with high accuracy of alignment with the gate wiring 13g, the intermediate electrodes 13s and 13d, which are underlying, by using the concave-convex part 15A as an alignment mark.

Here, on the source wiring 15s and the drain wiring 15d, a protective film can be provided by depositing silicon oxide, silicon nitride, PSG, or the like if necessary.

A thin-film transistor 1 is thus manufactured through the above-mentioned steps.

As described above, the method for manufacturing a semiconductor device of exemplary embodiments of the present invention includes liquid-phase process in part of its manufacturing steps, which provides highly flat film surfaces. Therefore, no breaking or other problems occur in forming wirings because of a step between them, which makes it possible to manufacture highly reliable transistors with a high yield ratio.

Also in exemplary embodiments of this invention, the conductive pillars Ms and Md to connect between layers are formed before forming the gate insulating film 12. Then, the gate insulating film 12 is formed so as to bury the surrounding of the conductive pillars Ms and Md. Therefore, it is not necessary to form the contact hole after forming the insulating film as in the related art way. Thus, no etching damage occurred in the semiconductor film 11, which is underlying. Especially in this method, the conductive pillars Ms and Md are protruded from the surface of the gate insulating film 12 to provide the concave-convex part 13A on the surface of the gate wiring film 13 that is formed on the gate insulating film 12. Using the concave-convex part 13A as an alignment mark, it is possible to pattern the gate wiring film 13 with high accuracy of alignment with the semiconductor film 11, which is underlying.

While the openings H1 and H2 are formed by dry etching in the exemplary embodiment, the openings H1 and H2 can be formed by using masking material (mask method). In this mask method, mask pillars having pillar shape (masking material) are formed on the intermediate electrodes 13s and 13d. The mask pillar can be formed by applying, for example, a light-sensitive material such as a resist on the whole surface of the substrate, and then performing exposure, development, baking, and other processing. Alternatively, the mask pillar can be formed by selectively dropping a liquid material containing an insulating material on a position to form the above-mentioned openings by a droplet discharge method, and then drying and annealing the material. The thickness (height) of the mask pillar is set equal to or more than the thickness of the interlayer insulating film 14 that will be formed afterward. By this way, the mask pillar remains above the interlayer insulating film 14. In other words, the upper parts of the mask pillars are protruded from the surface of the interlayer insulating film 14. Then, the interlayer insulating film 14 composed of silicon oxide etc., is deposited around the mask pillars, that is, on the whole surface of the substrate excluding the mask pillars, by liquid-phase processing. Finally, the mask pillars are removed by removing solution, etc. Thus, the openings H1 and H2 are formed at the position on which the mask pillars have been provided. By this method, since etching is not used, damage is not given to a lower layer side.

In addition, the wirings 15s and 15d can be formed by using the same method used to form the above-mentioned conductive pillars Ms and Md, and the intermediate electrodes 13s and 13d. In this case, the conductive pillars are firstly formed on the intermediate electrodes 13s and 13d respectively in the step shown in FIG. 1E. Then, the interlayer insulating film 14 is formed by liquid-phase processing. The conductive pillars are formed thicker than the interlayer insulating film 14 such that the upper end part of the conductive pillars are protruded from the surface of the interlayer insulating film 14. Subsequently, metal film is formed on the surface of the interlayer insulating film 14 and the surface of the conductive pillars. Then, the source wiring and the drain wiring are formed by patterning. In this step, the metal film that is opaque is provided on the whole surface of the substrate. Since a step having protruded shape is formed on the surface of the interlayer insulating film 14 by the conductive pillars, a concave-convex part caused by the step is formed on the surface of the metal film. Accordingly, by using the concave-convex part appearing on the surface of the metal film as an alignment mark, it is possible to pattern the metal film with high accuracy of alignment with the intermediate electrodes 13s and 13d, and the gate wiring 13g, which are underlying.

Second Exemplary Embodiment

Figure 3A:
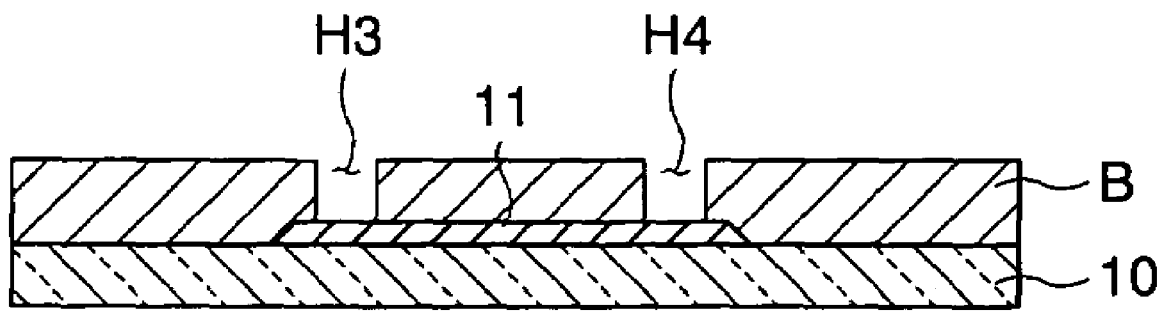
FIGS. 3A through 3C are schematics showing a method of manufacturing a thin-film transistor of a second exemplary embodiment of the present invention.
Figure 3B:
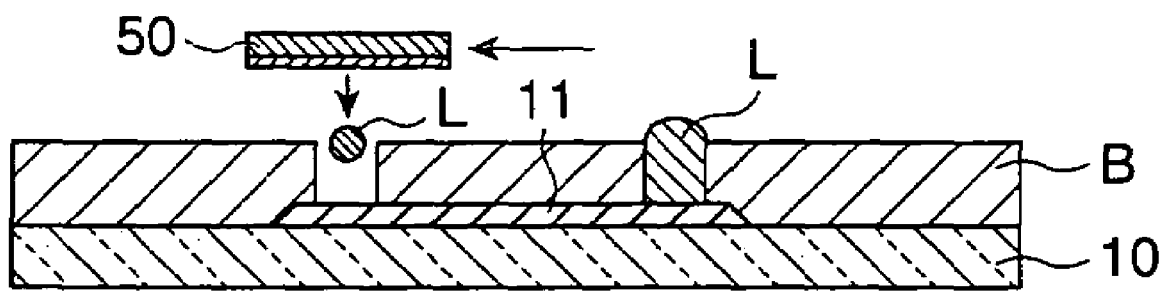

Referring now to FIG. 3, a second exemplary embodiment of the present invention will be described. In this exemplary embodiment, the same members and elements as those in the first exemplary embodiment will be given the same reference numerals, and further description thereof will be omitted.

In this exemplary embodiment, the conductive pillars Ms and Md in the first exemplary embodiment are formed by droplet discharge method. Firstly, a bank layer B shown in FIG. 3A is formed on the substrate 10 from the condition shown in FIG. 1A. The bank layer B includes openings H3 and H4 that correspond to the source region and drain region of the semiconductor film 11 respectively. The bank layer B can be formed by applying a light-sensitive organic material such as a resist on the whole surface of the substrate, and then performing exposure, development, baking, and other processing.

The bank layer B can be hardened if necessary. Hardening of the bank layer B is performed as mentioned below. First, the substrate 10 having the bank layer B is placed in a vacuum chamber (not shown). The pressure in the chamber is then reduced to 1.3 kPa (10 Torr) or less, for example, down to about 0.2 Torr. Subsequently, the bank layer B is heated to a typical photoresist postbaking temperature, for example, 100 to 150 degrees centigrade (up to 130 degrees centigrade for example), and also irradiated with ultraviolet rays of a wavelength of about 254 nm, for example, for several minutes. This process makes moisture dissolved and remaining in the bank layer B evaporate, and promotes cross-linking reactions by the ultraviolet rays. Since the bank layer B is not influenced by oxygen and moisture, it becomes densified by cross-linking reactions and enhances its heat and chemical resistance.

Moreover, hardening of the bank layer B can be performed by heat treatment that heats the bank layer B up to more than the postbaking temperature if necessary. This heat treatment is performed at, for example, 300 to 450 degrees centigrade for ten minutes. This process provides the bank layer with excellent heat and chemical resistance, and thereby a variety of liquid film-forming materials can be used. Here, ultraviolet-ray irradiation is not necessarily performed under reduced pressure. For example, it can be performed in an atmosphere where oxygen and moisture are substantially absent (e.g. in a nitrogen atmosphere).

In this sample, the bank layer B is hardened as mentioned above such that drying of liquid materials and annealing of the conductive pillars Ms and Md, which will be described later, can be conducted consistently.

Figure 3C:
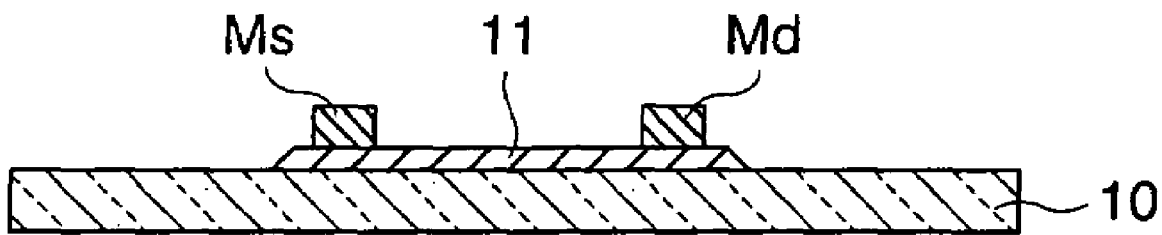

Next, a discharge head 50 is filed up with a liquid material including compositions of the conductive pillars Ms and Md (liquid material including conductive material). Then, the liquid material L is discharged (dropped) into the openings H3 and H4 of the bank layer B from the discharge nozzle while relatively moving the discharge head 50 and the substrate. Subsequently, by drying and annealing the discharged liquid material, the conductive pillars Ms and Md are formed. FIG. 3C is a diagram showing the condition in which the bank layer B is removed by a removing solution, etc., after forming the conductive pillars Ms and Md.

In order to reduce or prevent the liquid material L from attaching to the upper part of the bank layer B in this step, it is preferable to provide the bank layer B with liquid repellency in advance. Providing the bank layer B with liquid repellency can be carried out by breaking a gas containing fluorine elements such as carbon tetrafluoride down into active fluorine monatomic elements and ions by using atmospheric pressure plasma, and exposing the bank layer B to the active fluorine. If the bank layer B is formed by using a liquid repellent photoresist containing fluorine elements, this liquid repellency process is not needed.

The following steps are the same as those in the first exemplary embodiment.

As described above, since the conductive pillars Ms and Md are formed by droplet discharge method in this exemplary embodiment, steps are simple and manufacturing equipment can be downsized as compared with the case where the conductive pillars are formed by vacuum processing in the first exemplary embodiment. In addition, in this exemplary embodiment, since the bank B is hardened as described above, heating steps (drying and annealing of the liquid material) can be conducted consistently, resulting in simplified step.

In this exemplary embodiment, while the bank layer 12 is formed before discharging the liquid material L, the bank layer B is not necessarily required, the liquid material L can be dropped on the semiconductor film 11 without the bank layer B. Of course, since the method causes the fluctuation of discharged positions and wide spreading of the droplet on the substrate, the application of this method is limited to the devices in which large pattern rule is employed.

Third Exemplary Embodiment

Referring now to FIG. 4, a third exemplary embodiment of the present invention will be described. In this exemplary embodiment, the same members and elements as those in the first exemplary embodiment will be given the same reference numerals, and further description thereof will be omitted.

Figure 4A:
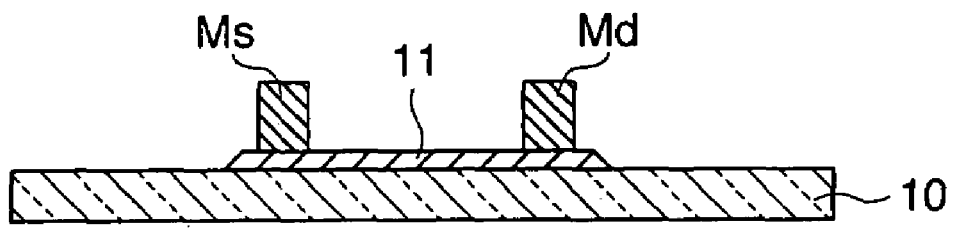
FIGS. 4A through 4D are schematics showing a method of manufacturing a thin-film transistor of a third exemplary embodiment of the present invention.

In this exemplary embodiment, the gate wiring film 13 in the first exemplary embodiment is formed by liquid-phase processing. Firstly, as shown in FIG. 4A, the conductive pillars Ms and Md having pillar shape are formed on the surface of the semiconductor film 11 from the condition shown in FIG. 1A. In this example, the conductive pillars Ms and Md are formed thicker than the total thickness of the gate insulating film 12 and gate wiring film 13, which will be described later, such that the upper end part of the conductive pillars Ms and Md are protruded from the surface of the gate wiring film 13. That is, in this example, since the gate wiring film 13 is formed by liquid-phase processing different from the first exemplary embodiment, a concave-convex pattern, which is underlying, is not reflected to the film surface of the gate wiring film 13. Therefore, if the conductive pillars Ms and Md are buried in the gate wiring film 13, the surface of the gate wiring film 13 is thoroughly flat, so that the alignment with the semiconductor film 11, which is underlying, cannot be taken. For this reason, at least a part of the conductive pillars Ms and Md is made to be exposed from the gate wiring film 13. Especially in this example, top surfaces of the gate wiring film 13 and the conductive pillars Ms and Md form a substantially flat plane in order to form the openings (contact holes) all together at the intermediate electrode part and gate wiring part with the same etching conditions if the interlayer insulating film 14 is formed on the gate insulating film 12.

Figure 4B:
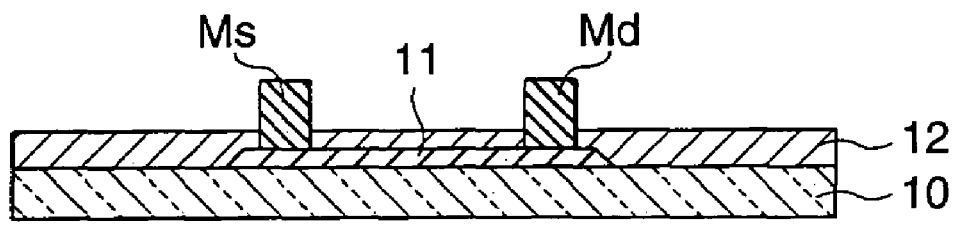

As shown in FIG. 4B, the gate insulating film 12 composed of silicon oxide etc., is deposited around the conductive pillars Ms and Md, that is, on the whole surface of the substrate excluding the conductive pillars Ms and Md, by liquid-phase processing. This process is the same as that in the first exemplary embodiment. That is, an embrocation containing xylene mixed with polysilazane (a liquid material containing polysilazane) is spin-coated on the substrate. Then, prebaking is performed at 100 to 150 degrees centigrade for five minutes. Subsequently, heat treatment is performed at 300 to 400 degrees centigrade in a wet $O_2$ atmosphere for 60 minutes. Performing the heat treatment in a wet $O_2$ atmosphere can reduce nitrogen components in the insulating film that cause polarization.

Figure 4C:
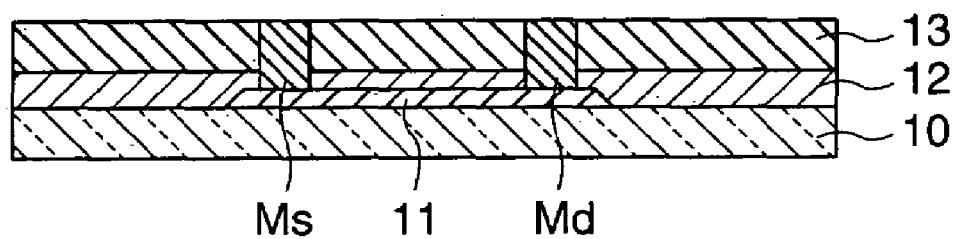

As shown in FIG. 4C, the gate wiring film 13 is deposited around the conductive pillars Ms and Md, that is, on the whole surface of the substrate excluding the conductive pillars Ms and Md, by liquid-phase processing. First, an embrocation in which metal fine particles are dispersed in an organic solvent (a liquid material containing a conductive material) is spin-coated on the substrate. Then it is dried and annealing by heating. In this case, the film thickness of the gate wiring film 13 is taken as thickness of approximately the same grade as the height of the step between the gate insulating film 12 and the conductive pillars Ms and Md. Thus, the gate wiring film 13 is provided.

Figure 4D:
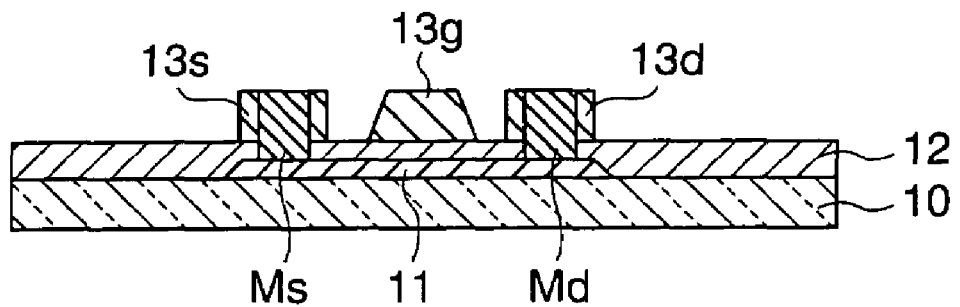

Next, as shown in FIG. 4D, the gate wiring film 13 is patterned so as to form a gate wiring 13g including a gate electrode, the intermediate electrode for source 13s and the intermediate electrode for drain 13d. Since a part of the conductive pillars Ms and Md is exposed on the surface of the gate wiring film 13, in this example as mentioned above, it is possible to pattern the gate wiring film 13 and the intermediate electrodes 13s and 13d with high accuracy of alignment with the semiconductor film 11, which is underlying, by using the exposed part of the conductive pillar as an alignment mark. The following steps are the same as those in the first exemplary embodiment.

As described above, in this exemplary embodiment, since the gate wiring film 13 is formed by liquid-phase processing, the level of film surface of the gate wiring film 13 and the conductive pillars Ms and Md can be made to be substantially on the same plane. Accordingly, the height among the gate wiring film 13g and the intermediate electrodes 13s and 13d is substantially equal. If an interlayer insulating film is formed on it to open contact holes, this makes it possible to form the contact holes all together to the interlayer insulating film with the same etching conditions.

Figure 5A:
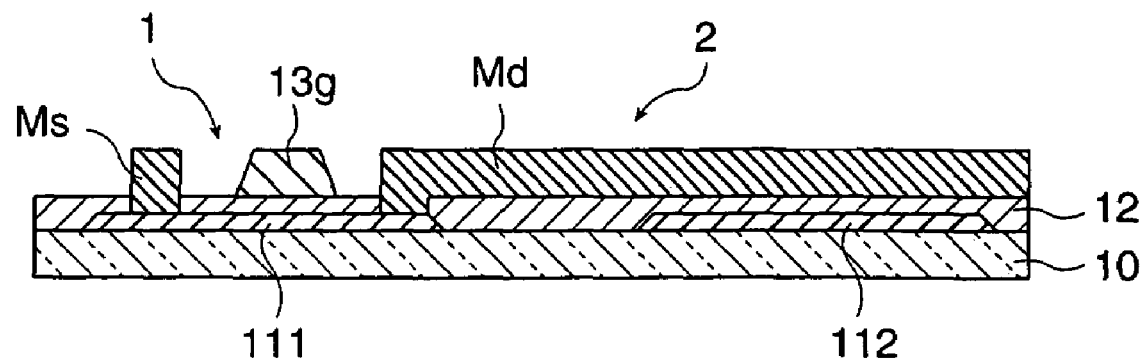
FIGS. 5A and 5B are schematics showing a thin film transistor manufactured by the method of the invention.
Figure 5B:
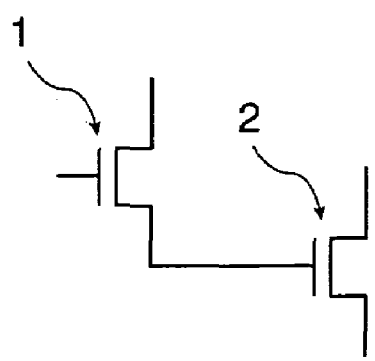

In the above-mentioned exemplary embodiments, while the method of manufacturing a thin film transistor is described, various kinds of electronic circuits can be fabricated by means of the method of exemplary embodiments of the invention in addition to the thin film transistor. FIGS. 5A and 5B are diagrams showing a part of an electronic circuit (for example, inverter circuit) manufactured by means of the method of the exemplary embodiments. FIG. 5A is a sectional drawing schematically illustrating an element construction. FIG. 5B is a circuit diagram of the element. The circuit in FIG. 5B and FIG. 5A is one in which two thin film transistors are connected and the intermediate electrode for drain 13d of a transistor 1 is extended to the region for forming a semiconductor film 112 in a transistor 2 and used as a part of the wiring of the transistor 2 associated with the semiconductor film 112, for example, gate wiring.

(Electronic Equipment)

Electronic equipment according to the exemplary embodiments of present invention will now be described.

Figure 6:
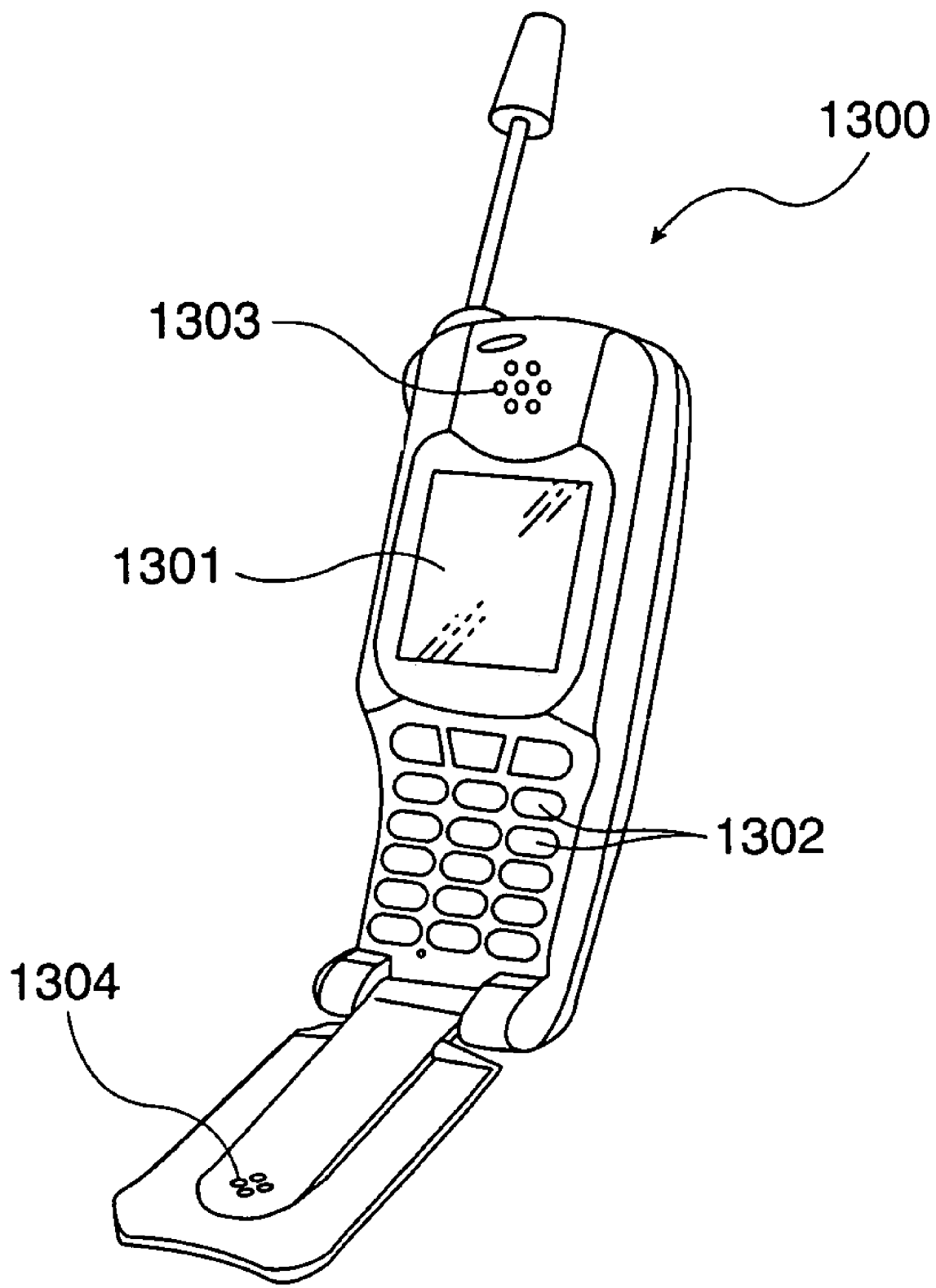
FIG. 6 is a schematic showing an example of electronic equipment according to exemplary embodiments of the present invention.

FIG. 6 is a schematic showing an example of electronic equipment according to exemplary embodiments of the present invention. A cellular phone 1300 shown in this diagram includes a semiconductor device manufactured by one of the above-mentioned methods inside its case or in its display part 1301. The drawing also shows operation buttons 1302, an earpiece 1303, and a mouthpiece 1304.

The semiconductor device according to any of the above-mentioned exemplary embodiments can be applied not only to cellular phones, but also to electronic books, personal computers, digital still cameras, liquid crystal televisions, video tape recorders of viewfinder types or monitor viewing types, car navigation devices, pagers, electronic notebooks, electric calculators, word processors, work stations, picture phones, point-of-sale (POS) terminals, apparatuses equipped with a touch panel, and so on. The semiconductor device according to exemplary embodiments of the present invention provides any of the above-mentioned electronic equipment with higher performance.

While the preferred exemplary embodiments according to the present invention have been described referring to the accompanying drawings, it is understood that the exemplary embodiments of present invention is not limited to these examples.

For example, the order of each of the steps in the above-mentioned exemplary embodiments is not limited to the described orders.

While the semiconductor film 11 is made by being transformed into a polycrystalline film in the above-mentioned exemplary embodiments, an amorphous semiconductor film (amorphous silicon film) can also be used as an active layer of a transistor. Also, while both the gate insulating film 12 and the interlayer insulating film 14 are made into polysilazane burned films in the present exemplary embodiment, either of the insulating films may be a film other than a polysilazane burned film (e.g. a CVD or PVD film). Moreover, while the above-mentioned exemplary embodiments show examples in which the methods for manufacturing a semiconductor device according to exemplary embodiments of the present invention are applied to manufacturing of top-gate transistors, applications of the exemplary embodiments of the present invention are not limited to them. Exemplary embodiments of the present invention can also be applied to manufacturing of bottom-gate transistors and manufacturing of semiconductor devices other than transistors. Furthermore, the shapes, combinations, and the like of each component member described in the above-mentioned examples are presented by way of example. Various modifications can be made in accordance with design requirements or the like, without departing from the spirit and scope of exemplary embodiments of the present invention.

What is claimed is:

1. A method of manufacturing a semiconductor device, comprising:
   forming a conductive pillar on a portion of a first semiconductor film;
   forming a gate insulating film over the first semiconductor film to a protruding portion of the conductive pillar, a part of the conductive pillar protrudes from the gate insulating film; and
   forming a conductive film over the gate insulating film; and
   forming a gate wiring and an intermediate electrode by patterning the conductive film using the conductive pillar as an alignment mark, the intermediate electrode being attached to at least a side part of the protruding portion of the conductive pillar.

2. The method according to claim 1,
the forming of the conductive pillar including discharging a liquid material to a portion of the first semiconductor film by a droplet discharge method, the liquid material including a conductive material.

3. The method according to claim 2, further comprising:
forming a bank layer over the semiconductor film before the forming of the conductive pillar, the bank layer including a hole above the position of the first semiconductor film.

4. The method according to claim 3,
the bank layer being made of an organic material.

5. The method according to claim 4,
the forming the bank layer including a step of forming a first layer over the first semiconductor film, a step of irradiating the first layer with a light and heating the first layer in an atmosphere so as to transform the first layer to the bank layer, the atmosphere including oxygen and moisture.

6. The method according to claim 1,
the forming of the gate insulating film by discharging a liquid insulating material.

7. The method according to claim 1,
the forming of the conductive film being carried out by one of chemical vapor deposition or physical vapor deposition.

8. The method according to claim 1,
the forming of the conductive film being carried out by discharging a liquid material to the first semiconductor film.

9. The method according to claim 8,
the conductive film and the conductive pillar forming a substantially flat surface.

10. The method according to claim 1,
the conductive pillar being extended to a forming region for a second semiconductor film formed at a position different from a position at which the first semiconductor film is formed and used as a part of wiring corresponding to the second semiconductor film.

11. An electronic equipment, comprising:
a semiconductor device manufactured by the method according to claim 1.

12. The method according to claim 1,
the conductive film and a top portion of the conductive pillar forming a same surface before the patterning of the conductive film, the patterning being executed by using the top portion of the conductive pillar as the alignment mark.

13. The method according to claim 12,
the conductive pillar including aluminum, the conductive film including at least one of tantalum and titanium.

14. The method according to claim 12,
the conductive pillar including a first metal, the conductive film including a second metal, the first and second metals being different so that a difference of the metals are used as the alignment mark.

15. The method according to claim 1,
the intermediate electrode being used as one of a source electrode and a drain electrode.

16. The method according to claim 1,
a height of the intermediate electrode and a height of the conductive pillar being equal after patterning the conductive film.

* * * * *